(12) United States Patent  (10) Patent No.: US 8,724,974 B2
Ohmi et al.  (45) Date of Patent: May 13, 2014

(54) VAPORIZER

(75) Inventors: Tadahiro Ohmi, Miyagi (JP); Yasuyuki Shirai, Miyagi (JP); Masaaki Nagase, Osaka (JP); Satoru Yamashita, Osaka (JP); Atsushi Hidaka, Osaka (JP); Ryousuke Dohi, Osaka (JP); Kouji Nishino, Osaka (JP); Nobukazu Ikeda, Osaka (JP); Keiji Hirao, Osaka (JP)

(73) Assignees: Fujikin Incorporated, Osaka (JP); Tohoku University, Miyagi (JP)

( * ) Notice: Subject to any disclaimer, the term of this patent is extended or adjusted under 35 U.S.C. 154(b) by 0 days.

(21) Appl. No.: 13/563,983

(22) Filed: Aug. 1, 2012

(65) Prior Publication Data

US 2013/0084059 A1   Apr. 4, 2013

Related U.S. Application Data

(63) Continuation of application No. PCT/JP2012/004702, filed on Jul. 24, 2012.

(30) Foreign Application Priority Data

Sep. 30, 2011   (JP) ................................ 2011-216885

(51) Int. Cl.
  *B01D 7/00* (2006.01)
(52) U.S. Cl.
  USPC .......................................................... 392/389
(58) Field of Classification Search
  CPC .................................. C23C 14/00; F22B 1/284
  USPC ............ 392/389, 394–399; 428/116; 422/129
  See application file for complete search history.

(56) References Cited

U.S. PATENT DOCUMENTS

| 7,300,038 B2 | 11/2007 | Gregg et al. | |
| 8,128,073 B2* | 3/2012 | Gregg et al. | 261/142 |
| 2003/0217697 A1 | 11/2003 | Miyamoto et al. | |
| 2007/0071653 A1* | 3/2007 | Miyamoto et al. | 422/129 |
| 2011/0100483 A1 | 5/2011 | Nagata et al. | |

FOREIGN PATENT DOCUMENTS

| JP | 63-303825 A | 12/1988 |
| JP | 02-129370 A | 5/1990 |
| JP | 2002-088477 A | 3/2002 |
| JP | 2003-273026 A | 9/2003 |
| JP | 2009-252760 A | 10/2009 |
| JP | 2010-180429 A | 8/2010 |
| JP | 2010-284628 A | 12/2010 |

OTHER PUBLICATIONS

International Search Report issued in corresponding application No. PCT/JP2012/004702, completed Aug. 15, 2012 and mailed Aug. 28, 2012.

* cited by examiner

*Primary Examiner* — Dana Ross
*Assistant Examiner* — Renee L Miller
(74) *Attorney, Agent, or Firm* — Griffin & Szipl, P.C.

(57) ABSTRACT

A vaporizer, capable of stabilizing the behavior of pressure inside the vaporizer, includes a chamber having an inlet and an outlet, a heating device that heats the inside of the chamber, a partition wall structure 13 that is provided inside the vaporizer and partitions the liquid material inside the chamber into a plurality of sections, and liquid distribution portions 20 that are provided at the lower portion of the partition wall structure 13 and that allow liquid distribution among the sections partitioned by the partition wall structure 13, and the partition wall structure includes a grid-like, honeycomb-shaped, mesh-like, or pipe-shaped partition wall.

16 Claims, 7 Drawing Sheets

(a) 16, 16a, 20

(b) 17, 17a, 20

(c) 18, 18a, 20

(d) 19, 19a, 20

(a)

(b)

(c)

VAPORIZER

This is a Continuation of International Patent Application No. PCT/JP2012/004702 filed Jul. 24, 2012, which claims priority on Japanese Patent Application No. 2011-216885, filed Sep. 30, 2011. The entire disclosures of the above patent applications are hereby incorporated by reference.

TECHNICAL FIELD OF THE INVENTION

The present invention relates to a vaporizer, mainly specifically, to a vaporizer for vaporizing a liquid metal-organic material.

BACKGROUND ART OF THE INVENTION

Conventionally, in a deposition process of a compound semiconductor or ITO film, etc., metal organic chemical vapor deposition (MOCVD) is used. In MOCVD, a vaporizer that vaporizes a liquid metal-organic material by bubbling it with a carrier gas, that is, using a bubbling method is widely known (See, e.g., Patent Documents 1 and 2, etc.). However, in a vaporizer using a bubbling method, vaporized gas supply concentration fluctuates according to fluctuations of various parameters, such as the bubbling flow rate, the liquid level, the air bubble diameter in bubbling, and the liquid temperature.

Therefore, a liquid material vaporization and supply system is proposed (Patent Document 3), which vaporizes a material gas by heating in a vaporizer without using a carrier gas, and carries out flow control of the vaporized material gas by means of a high-temperature-capable pressure regulating flow rate control device, and supplies the gas into a reaction container. By performing flow rate control of a metal-organic gas by using the liquid material vaporization and supply system, the flow rate can be controlled without influences from the bubbling flow rate, etc., that becomes a problem in the bubbling method.

PRIOR ART DOCUMENTS

Patent Documents

[Patent Document 1]
Japanese Unexamined Patent Publication No. 2002-88477.
[Patent Document 2]
Japanese Unexamined Patent Publication No. 2010-284628.
[Patent Document 3]
Japanese Unexamined Patent Publication No. 2009-252760.

Problem to be Solved by the Invention

However, in the above-described liquid material vaporization and supply system, a metal-organic material is a liquid material that is intermittently supplied into a vaporizer at controlled timings. However, the behavior of the pressure inside the vaporizer after the liquid material is supplied is unstable and changes each time the liquid material is supplied. Therefore, a main object of the present invention is to provide a vaporizer capable of stabilizing the behavior of the pressure inside the vaporizer.

SUMMARY OF THE INVENTION

Means for Solving the Problem

In order to achieve the above-described object, a vaporizer according to the present invention includes a chamber having an inlet and an outlet, a heating device that heats a liquid material contained in the chamber, a partition wall structure that partitions the liquid material inside the chamber into a plurality of sections, and liquid distribution portions that allow liquid distribution among the sections partitioned by the partition wall structure, wherein the partition wall structure includes a grid-like, honeycomb-shaped, mesh-like, or pipe-shaped partition wall.

The liquid distribution portions are preferably notched portions formed in the lower end of the partition wall structure. The partition wall structure is preferably formed by joining a plurality of partition wall plates so as to cross each other. Preferably, the partition wall plates include first partition wall plates and second partition wall plates, and the first partition wall plates have first slits extending downward from the upper ends, and are joined to the second partition wall plates by inserting the second partition wall plates into the first slits. Preferably, the partition wall plates include first partition wall plates and second partition wall plates, and the second partition wall plates have second slits extending upward from the lower ends, and are joined to the first partition wall plates by inserting the first partition wall plates into the second slits. Preferably, the partition wall plates include first partition wall plates and second partition wall plates, wherein the first partition wall plates have first slits extending downward from the upper ends, the second partition wall plates have second slits extending upward from the lower ends, and by inserting the second slits into the lower ends of the first slits, the first plates and the second plates are joined to each other.

Thus, in accordance with a first non-limiting embodiment of the present invention, a vaporizer is provided that includes: (a) a chamber having an inlet and an outlet; (b) a heating device that heats a liquid material contained in the chamber; (c) a partition wall structure that partitions the liquid material inside the chamber into a plurality of sections; and (d) liquid distribution portions that allow liquid distribution among the sections partitioned by the partition wall structure, wherein the partition wall structure includes a grid-like, honeycomb-shaped, mesh-like, or pipe-shaped partition wall. In accordance with a second non-limiting embodiment of the present invention, the first non-limiting embodiment is modified so that the liquid distribution portions are notched portions formed in the lower end of the partition wall structure. In accordance with a third non-limiting embodiment of the present invention, the first non-limiting embodiment is modified so that the partition wall structure is formed by joining a plurality of partition wall plates so as to cross each other. In accordance with a fourth non-limiting embodiment of the present invention, the third non-limiting embodiment is further modified so that the partition wall plates include first partition wall plates and second partition wall plates, and the first partition wall plates have first slits extending downward from the upper ends, and are joined to the second partition wall plates by inserting the second partition wall plates into the first slits. In accordance with a fifth non-limiting embodiment of the present invention, the third non-limiting embodiment is modified so that the partition wall plates include first partition wall plates and second partition wall plates, and the second partition wall plates have second slits extending upward from the lower ends, and are joined to the first partition wall plates by inserting the first partition wall plates into the second slits. In accordance with a sixth non-limiting embodiment of the present invention, the third non-limiting embodiment is modified so that the partition wall plates include first partition wall plates and second partition wall plates, the first partition wall plates have first slits extending downward from the upper ends, the second partition wall plates have second slits extending upward from the lower ends, and by inserting the second slits into the lower ends of the first slits, the first plates and the second plates are joined to each other.

Effect of the Invention

In the vaporizer according to the present invention, a partition wall structure that partitions a liquid material that is vaporized inside a chamber into a plurality of divided sections is provided, so that heat distribution in the liquid material is made uniform and the liquid material temperature is prevented from being made uneven by generation of a large convection, and accordingly, the behavior of pressure inside the vaporizer can be made constant.

DETAILED DESCRIPTION OF THE INVENTION

Best Mode for Carrying Out the Invention

A mode for carrying out the present invention is described hereinafter with reference to FIG. 1 to FIG. 10. In all of the drawings, the same components are provided with the same reference symbols.

Figure 1:
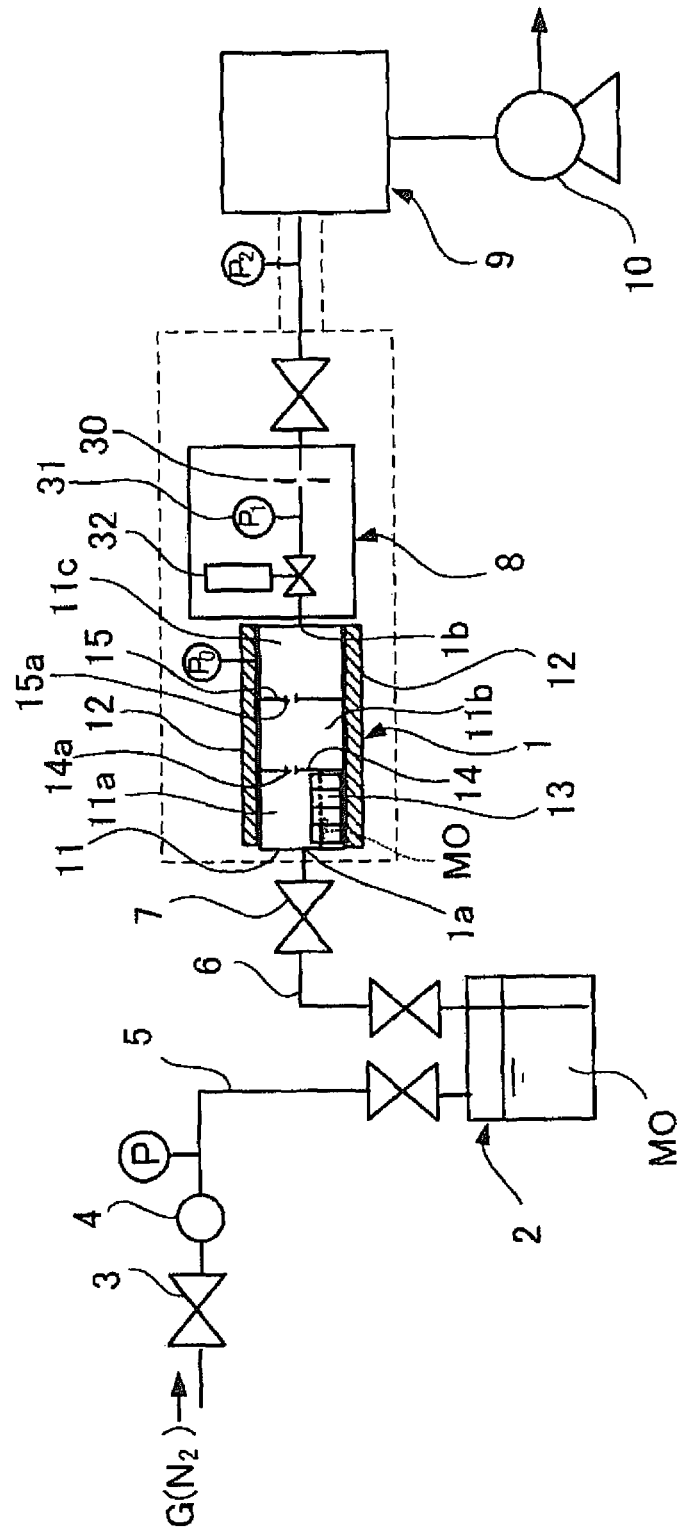
FIG. 1 is a schematic configuration diagram showing a preferred embodiment of a liquid material vaporization and supply system including a vaporizer according to the present invention.

FIG. 1 is a schematic configuration diagram showing a preferred embodiment of a liquid material vaporization and supply system including a vaporizer 1. Referring to FIG. 1, in the liquid material vaporization and supply system, a metal-organic material MO, which is a liquid material stored in a pressure-tight and airtight liquid material container 2, is pressed out from the liquid material container 2 through a liquid material carrier pipe 6, one end of which is submerged in the liquid material MO according to pressure-feeding of an inert pressure-feeding gas G, such as nitrogen gas, to the upper portion of the liquid material container 2 through a pressure-feeding gas supply pipe 5 via a valve 3 and a regulator 4, and then supplied to the vaporizer 1 via a valve 7. The gas obtained by vaporization of the metal-organic material in the liquid state, by heating to a predetermined temperature inside the vaporizer 1, is fed to a pressure regulating flow rate control device 8 with a necessary steam pressure according to the heating temperature, and is subjected to flow rate control there, and is supplied to the reaction container 9. The reaction container 9 is decompressed by a vacuum pump 10 on the downstream side. The region enclosed by the dashed lines in FIG. 1 indicates a heated region.

The vaporizer 1 includes a chamber 11 having an inlet 1a and an outlet 1b, a heating device 12 that heats the inside of the chamber 11, and a partition wall structure 13 that partitions the liquid material, which is disposed in the chamber 11 and vaporized inside the chamber 11, into a plurality of sections. The chamber 11 of the illustrated example is compartmented into a plurality of compartments 11a, 11b, and 11c by compartment walls 14 and 15 having through holes 14a and 15a, respectively. The partition wall structure 13 is housed in the first compartment 11a into which the metal organic material, which is a liquid material, is supplied, and metal-organic gas vaporized in the first compartment 11a can be sufficiently heated by passing through the second compartment 11b and the third compartment 11c. The number of compartments in the chamber 11 can be properly set, and may be one. The chamber 11 can be made of, for example, stainless steel.

The heating device 12 can be configured by fixing heater plates to cover the front, rear, left and right side surfaces and the upper and bottom surfaces of the chamber 11. The heater plate may be formed by, for example, incorporating a heater in a plate made of aluminum or copper, etc. As an example of this heating device 12, a known heating device disclosed in Japanese Unexamined Patent Publication No. 2009-252760 can be used. The heating device 12 is not limited to one that heats the chamber 11 from the outside, and the heating device may be disposed inside the chamber 11.

The partition wall structure 13 can be formed into a grid-like assembly opened on upward and downward sides by joining a plurality of partition wall plates 16 to 19 perpendicularly to each other. In the partition wall plates 16 and 17, first slits 16a and 17a extending downward from the upper ends are formed, respectively. In the partition wall plates 18 and 19, second slits 18a and 19a extending upward from the lower ends are formed, respectively. By inserting the partition wall plates 18 and 19 into the first slits 16a and 17a and inserting the partition wall plates 16 and 17 into the second slits 18a and 19a, the partition wall plates 16 and 17 and the partition wall plates 18 and 19 are joined perpendicularly to each other. The second slits 18a and 19a are inserted into the lower ends of the first slits 16a and 17a, and the first slits 16a and 17a are inserted into the upper ends of the second slits 18a and 19a. By forming the partition wall structure 13 by joining the partition wall plates 16 to 19, the partition wall structure 13 can be manufactured at low cost. Also, only by fitting the first and second slits 16a to 19a, can the partition wall structure be easily assembled. The partition wall plates do not necessarily have to be joined perpendicularly into a square grid-like shape, and the partition wall plates may be joined to each other at an acute angle or at an obtuse angle as long as uniform surrounded sections are formed when the partition wall plates are joined together.

Liquid distribution portions 20, which allow liquid distribution among sections divided by the partition wall structure 13, are formed at the lower portion of the partition wall structure 13. As in the illustrated example, the liquid distribution portions 20 can be formed of notched portions formed in the lower ends of the partition wall structure 13. Alternatively, the liquid distribution portions may be through holes (not illustrated) formed in the partition wall structure. Alternatively, the liquid distribution portions may be formed of spaces formed between the bottom surface of the partition wall structure 13 and the inner bottom surface of the chamber 11 by interposing a spacer (not illustrated) in the lower portion of the partition wall structure 13, or by forming a convex portion (not illustrated) on the inner wall of the chamber 11. By distributing the liquid material among the sections divided by the partition wall through the liquid distribution portions 20, the liquid levels in the sections become equal to each other.

The above-described partition wall structure 13 partitions the liquid material stored in the vaporizer chamber 11 into a plurality of small sections. By housing this grid-like partition wall structure 13 in the chamber 11, the liquid material MO stored in each divided section is reduced in volume, and is easily uniformly heated, and the surface area of the liquid material that comes into contact with the partition wall structure (which acts as a heating portion according to heat transfer from the chamber inner surface) increases. As a result, heat uniformity of the liquid material stored in the sections increases, and an effect of preventing temperature imbalance due to generation of a large convection is obtained. According to this effect, as is clear later, stable behavior of the gas pressure inside the vaporizer 1 is always obtained. In other words, the partition wall structure facilitates the uniform transfer of heat from the inner surface of the chamber to the liquid material, which increases the uniform distribution of heat in the liquid material and prevents temperature imbalance due to the effects of convection generation.

As the pressure regulating flow rate control device 8, a conventionally known one may be used, such as includes an orifice 30, a pressure sensor 31, a control valve 32, and a control circuit (not illustrated), etc., as shown in FIG. 1. The pressure regulating flow rate control device 8 is one adaptable to high temperature.

The principle of flow rate control by such a pressure regulating flow rate control device 8 (also referred to as pressure type flow rate control device) is summarized as follows: "when the upstream side pressure of the orifice is twice as high as the downstream side pressure, the gas flowing out from the orifice reaches sonic speed, and the flow rate thereof depends on only the upstream side pressure." Therefore, when the relationship between the upstream side pressure $P_1$ and the downstream side pressure $P_2$ of the orifice is $P_1 > 2P_2$, the flow rate flowing-out from the orifice 30 is expressed by the following formula 1 (provided below), Numerical Formula 1

$$Q = \frac{SP_1}{\sqrt{T}} \cdot C, \tag{1}$$

and increases in proportion to the orifice cross-sectional area and the orifice upstream side pressure $P_1$. The semiconductor process is performed under reduced pressure, so that in many cases, the condition (critical expansion condition) of $P_1 > 2P_2$ is satisfied. Therefore, by detecting the orifice upstream side pressure $P_1$ and controlling the orifice upstream side pressure $P_1$ by using the control valve 32, the flow rate can be controlled.

In the case of $P_1 < 2P_2$, the downstream side pressure cannot be ignored, and the flow rate flowing out from the orifice is expressed by the following formula 2 (provided below), and flow rate control based on this numerical formula is performed, Numerical Formula 2

$$Q = S \cdot C \sqrt{\frac{P_2(P_1 - P_2)}{T}}. \tag{2}$$

In the formulas (1) and (2) above, Q designates volume flow rate (sccm) in terms of a standard state, S designates orifice cross-sectional area (mm$^2$), $P_1$ designates orifice upstream side pressure (absolute pressure kPa), $P_2$ designates orifice downstream side pressure (absolute pressure kPa), T designates gas temperature (K) on the orifice upstream, C designates a gas specific coefficient (determined according to molecular weight, gas density, and specific heat ratio of the gas).

Figure 6:
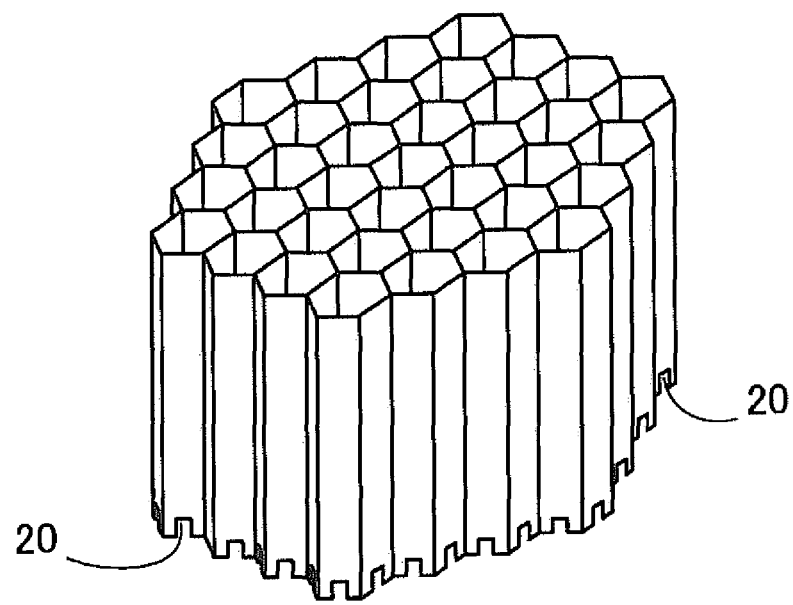
FIG. 6 is a perspective view showing still another preferred embodiment of the partition wall structure that is a component of the vaporizer according to the present invention.
Figure 7:
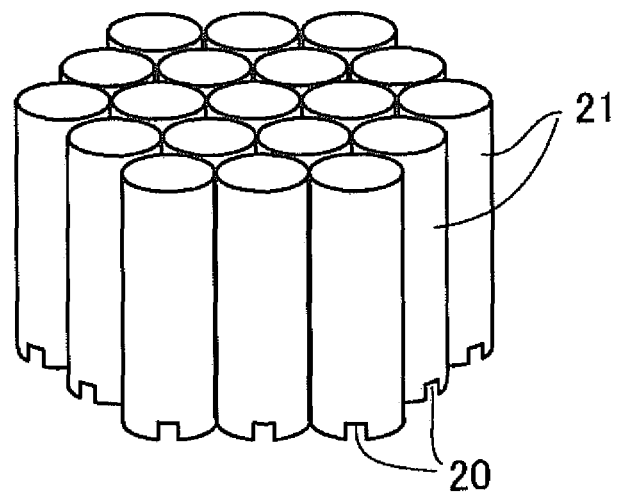
FIG. 7 is a perspective view showing still another preferred embodiment of the partition wall structure that is a component of the vaporizer according to the present invention.

In the above-described embodiment, a partition wall structure having a square grid-like shape in a plan view is illustrated; however, the partition wall structure may have a mesh-like shape that enables adoption of various shapes of the sections to be partitioned by a partition wall as shown in FIG. 5(a) to FIG. 5(c), or may have a honeycomb shape for partitioning regular hexagonal sections such as shown in FIG. 6 as long as the structure can (preferably uniformly) divide a storing range by storing the liquid material in the chamber 11 into a plurality of surrounded regions. Furthermore, the partition wall may be formed of pipe-shaped members, and, for example, as shown in FIG. 7, the partition wall structure can be formed by joining and integrating a plurality of pipe-shaped members 21 together by bundling and welding the pipe-shaped members.

EXAMPLE

Hereinafter, the present invention is described in detail by using an Example representing the present invention and a Comparative example. However, the present invention is not limited by the following Example.

Example of the Invention

Figure 2:
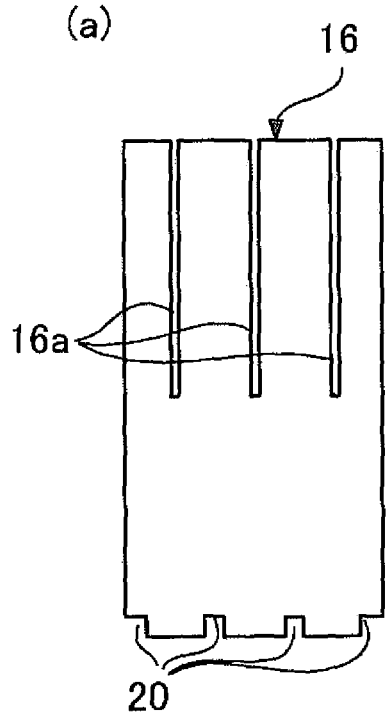
FIGS. 2 (a), (b), (c) and (d) are plan views showing partition wall plates before assembly of a partition wall structure that is a component of the vaporizer according to the present invention.
Figure 2:
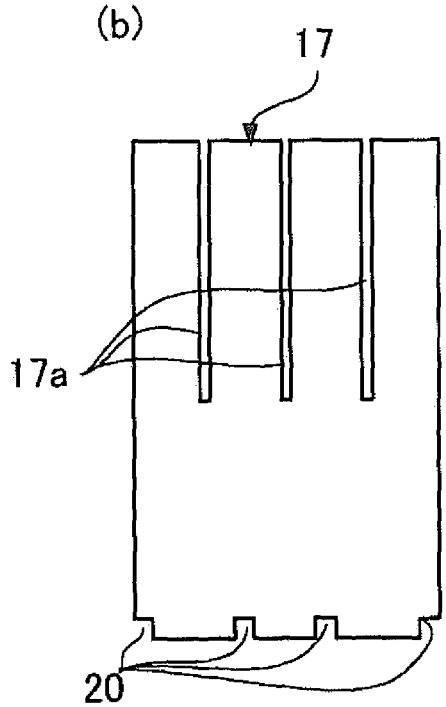
Figure 2:
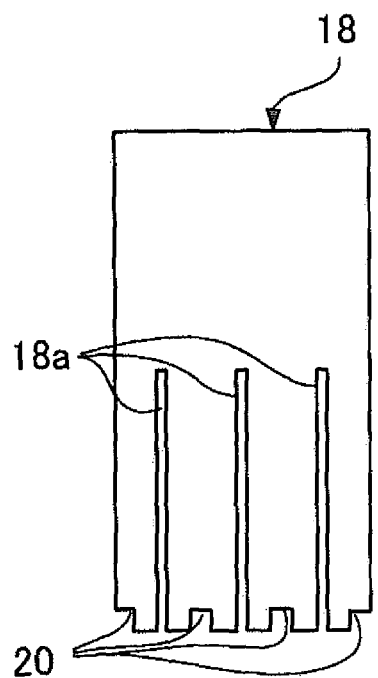
Figure 2:
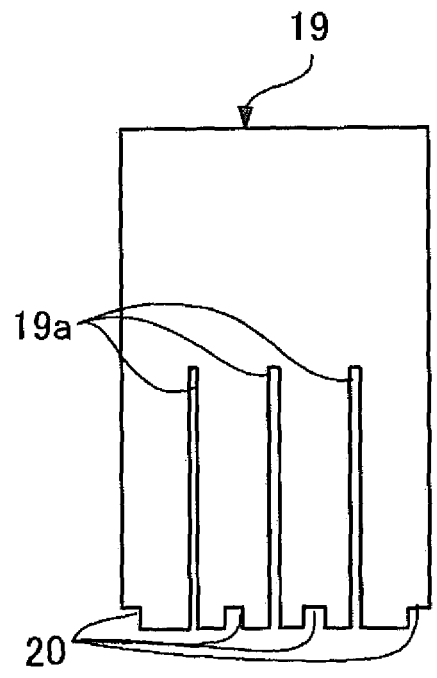
Figure 3:
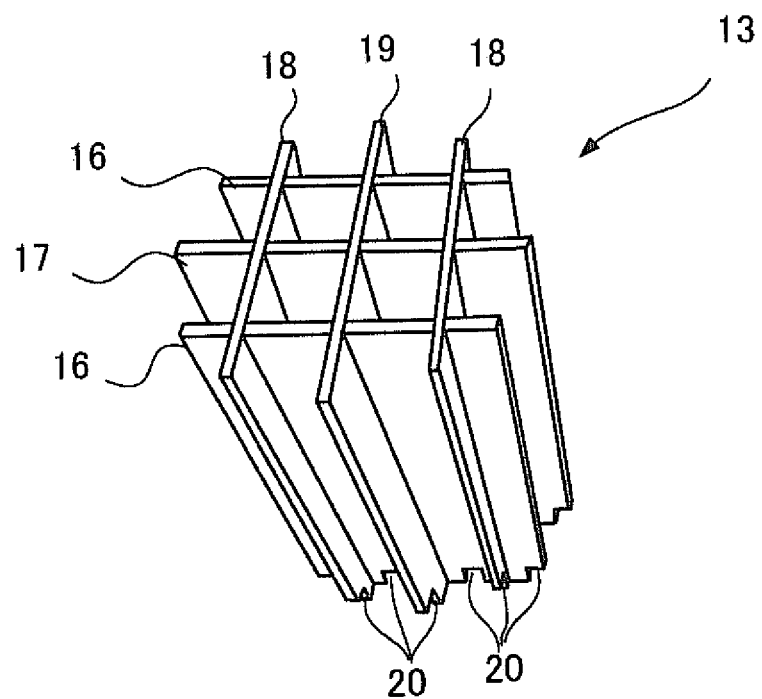
FIG. 3 is a perspective view obliquely from above of a partition wall structure formed by assembling the partition wall plates shown in FIG. 2.
Figure 4:
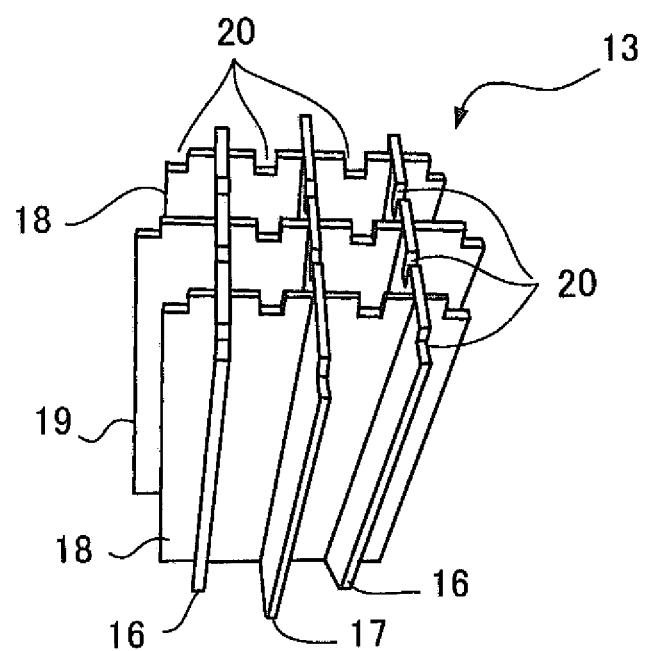
FIG. 4 is a perspective view from the bottom side of the partition wall structure shown in FIG. 3.
Figure 5:
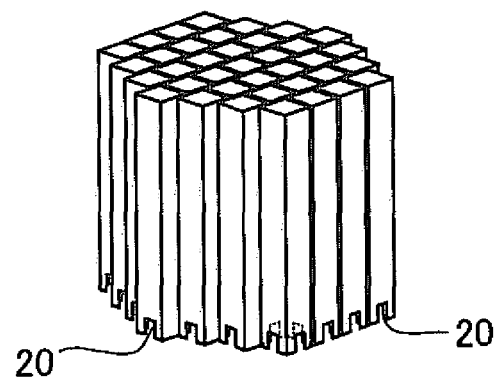
FIGS. 5 (a), (b) and (c) are perspective views showing other preferred embodiments of the partition wall structure that is a component of the vaporizer according to the present invention.
Figure 5:
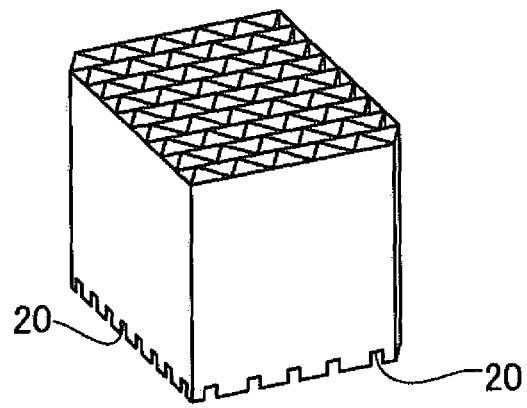
Figure 5:
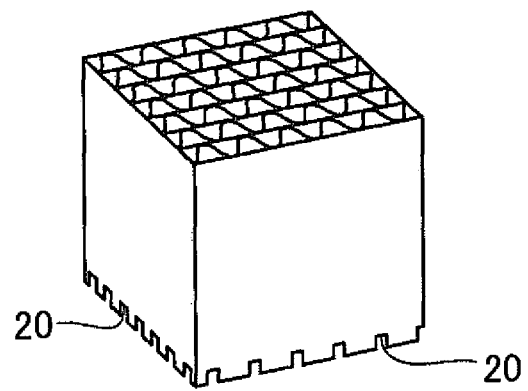
Figure 8:
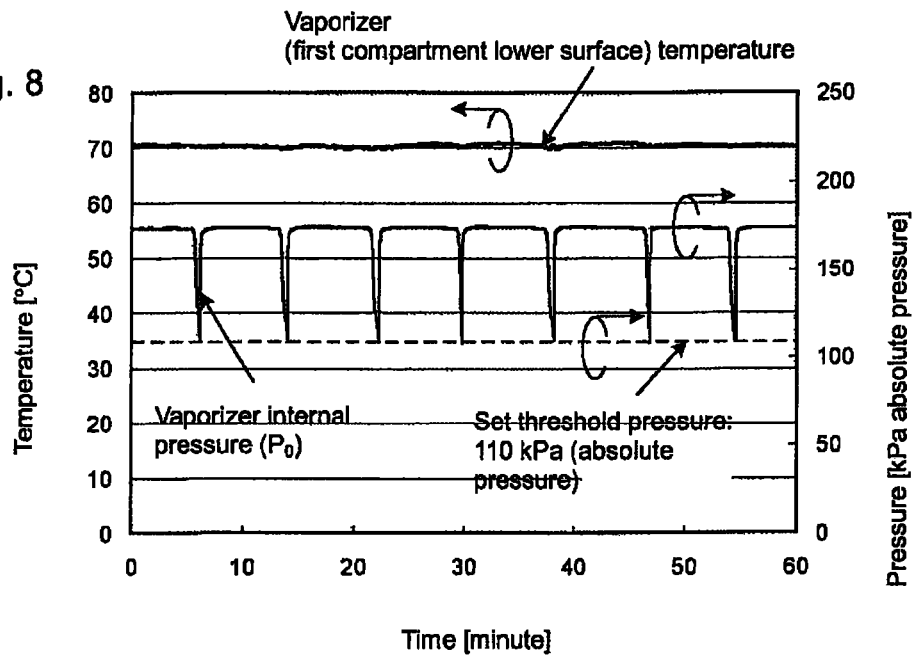
FIG. 8 is a graph showing time changes of pressure inside the vaporizer and temperature of the outer surface of the vaporizer when flow rate control is performed by a liquid material vaporization and supply system using an exemplary embodiment of the present invention.

In the Example, the same system as the liquid material vaporization and supply system shown in FIG. 1 was used, and the grid-like partition wall structure shown in FIG. 2 to FIG. 4 was housed in the vaporizer. The grid-like partition wall structure was formed of a stainless-steel plate with a thickness of 0.5 mm, which had a grid interval (length of one side of one grid section) of 3.6 mm and a height of 2.5 cm, and the height of the notched portions constituting the liquid distribution portions was set to 1 mm. TMGa (trimethyl gallium) was used as the liquid material. The pressure of the pressure-feeding gas (nitrogen gas) was set to an absolute pressure of 200 kPa. The heating device was controlled so that the temperature of the vaporizer reached 75° C. The downstream side pressure of the pressure regulating flow rate control device was set to 1.8 Torr, and the flow rate was controlled to 56 sccm by the pressure regulating flow rate control device. Control was performed so that when the liquid TMGa inside the vaporizer decreased and the pressure inside the vaporizer reached a set threshold pressure of 110 kPa (absolute pressure), TMGa inside the liquid material container was pressure-fed for 5 seconds into the vaporizer. Results of monitoring of time changes of the pressure ($P_O$) inside the vaporizer and the outside lower surface temperature of the vaporizer first compartment are shown in the graph of FIG. 8.

Comparative Example

In the Comparative example, the same conditions as in the Example described above were set except that the grid-like partition wall structure was not provided. Time changes of the pressure inside the vaporizer and the outside lower surface temperature of the vaporization chamber (first compartment) of the Comparative example are shown in the graph of FIG. 9.

Figure 9:
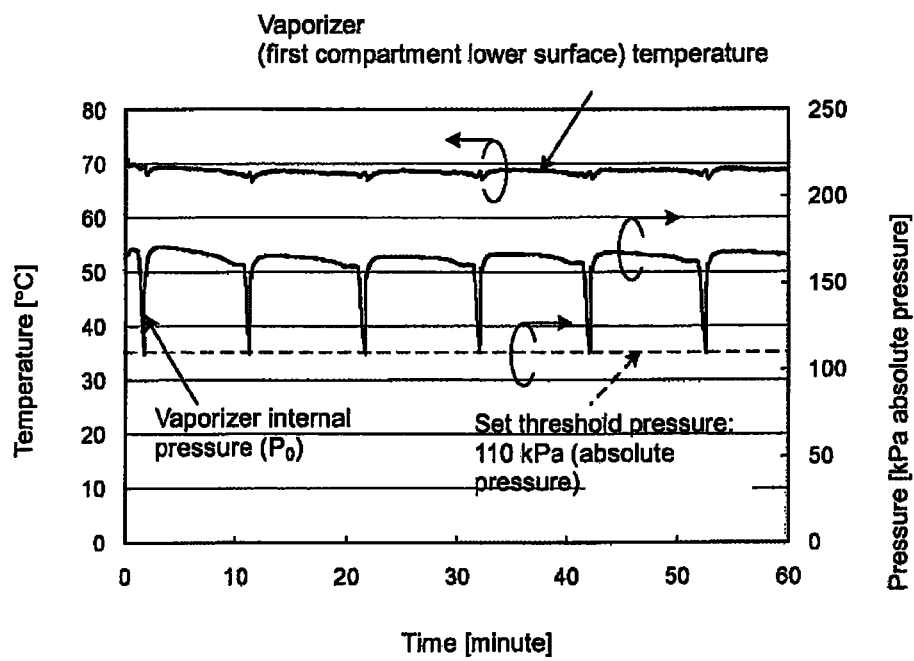
FIG. 9 is a graph showing time changes of pressure inside the vaporizer and temperature of the outer surface of the vaporizer when flow rate control is performed by a liquid material vaporization and supply system of a comparative example.
Figure 10:
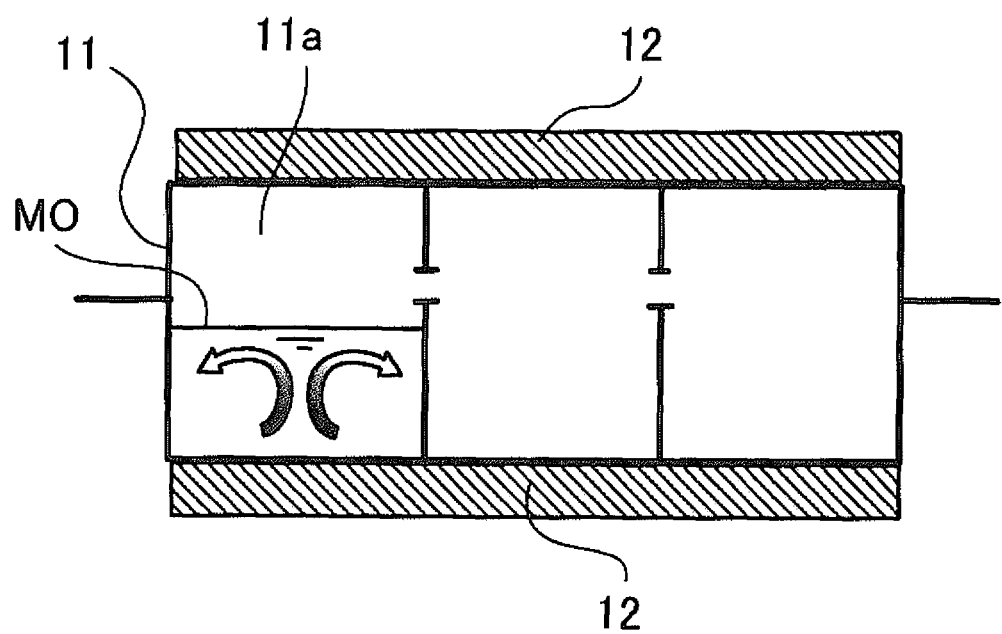
FIG. 10 is an explanatory view conceptually showing heat convection inside the vaporizer of the comparative example.

As seen in the graph of FIG. 9, in the Comparative example, the pressure inside the vaporizer tends to reach a maximum value while increasing, and then gradually decreases with time, and fluctuates in the range from approximately 170 kPa to 165 kPa, so it is not stable at a constant value. The behavior of the pressure inside the vaporizer after reaching the maximum value also changes each time the liquid TMGa is supplied. Specifically, there are two behavior patterns of the vaporizer internal pressure occurring in such a manner that vaporizer internal pressure gradually decreases, or is held at the same pressure, as the maximum value for several minutes after reaching the maximum value. The possible reason for this is that heat gradient in the liquid material supplied into the vaporizer generates a large convection (refer to the arrow in FIG. 10) across the entire inside of the vaporization chamber in the liquid and causes unevenness in steam pressure, and this influences the behavior of the vaporizer internal pressure.

On the other hand, in the above-described Example of the present invention, as seen in the graph of FIG. 8, the pressure inside the vaporizer is stable in the range of 173 to 174 kPa (absolute pressure), and shows almost the same behavior no matter how many times liquid TMGa is supplied into the vaporizer. The possible reason for this is that the liquid storing region is divided by the partition wall structure, and as a result, the temperature gradient in the liquid material is reduced, and the liquid material temperature is prevented from becoming uneven due to generation of a large convection, and the behavior of the pressure inside the vaporizer is accordingly made constant.

Comparing the graph of FIG. 8 and the graph of FIG. 9, it is shown that the temperature inside the vaporizer in the Comparative example remarkably changes although the temperature of the vaporizer outer surface in the Example is almost stable. As in the case of the Comparative example, if the temperature of the vaporizer is unstable, the steam pressure decreases according to a temperature decrease, and a target steam pressure cannot be obtained, and if the steam pressure decreases to be lower than the control pressure of the pressure regulating flow rate control device, normal flow rate control becomes impossible. On the other hand, as in the case of the Example, by stabilizing the temperature of the vaporizer, the above-described defect can be completely eliminated.

From the results of the Example and Comparative example described above, it is considered that by housing the partition wall structure in the vaporizer, heat distribution in the liquid metal-organic material can be made uniform, and convection can be prevented from being generated. Therefore, it was confirmed that a stable behavior of the vaporizer internal pressure could be obtained by housing the partition wall structure in the vaporizer.

In sum then, the present invention endeavors to provide a vaporizer capable of stabilizing the behavior of the pressure inside the vaporizer. The present invention achieves this objective by employing a vaporizer that includes a chamber having an inlet and an outlet, a heating device that heats the inside of the chamber, a partition wall structure 13 that is provided inside the vaporizer and partitions the liquid material inside the chamber into a plurality of sections, and liquid distribution portions 20 that are provided at the lower portion of the partition wall structure 13, which allow liquid distribution among the sections partitioned by the partition wall structure 13, and the partition wall structure includes a grid-like, honeycomb-shaped, mesh-like, or pipe-shaped partition wall.

DESCRIPTION OF REFERENCE SYMBOLS

1 Vaporizer
13 Partition wall structure
16, 17, 18, 19 Partition wall plate
16a, 17a First slit
18a, 19a Second slit
20 Liquid distribution portion

What is claimed is:

1. A vaporizer comprising:
   (a) a chamber having an inlet and an outlet;
   (b) a heating device disposed to heat a liquid material contained in the chamber;
   (c) a partition wall structure that partitions the liquid material inside the chamber into a plurality of sections; and
   (d) a plurality of liquid distribution portions that allow liquid distribution among the plurality of sections partitioned by the partition wall structure, wherein
   the partition wall structure includes a grid-shaped, honeycomb-shaped, mesh-shaped, or pipe-shaped partition wall, wherein the liquid distribution portions are notched portions or through holes formed in a lower end of the partition wall structure.

2. The vaporizer according to claim 1, wherein the partition wall structure comprises a plurality of partition wall plates joined together so as to cross each other.

3. The vaporizer according to claim 2, wherein the plurality of partition wall plates include first partition wall plates and second partition wall plates, and the first partition wall plates have slits extending downward from upper ends of the first partition wall plates, and the first partition wall plates are joined to the second partition wall plates by inserting the second partition wall plates into the slits of the first partition wall plates.

4. The vaporizer according to claim 2, wherein the plurality of partition wall plates include first partition wall plates and second partition wall plates, and the second partition wall plates have slits extending upward from lower ends of the second partition wall plates, and the second partition wall plates are joined to the first partition wall plates by inserting the first partition wall plates into the slits of the second partition wall plates.

5. The vaporizer according to claim 2, wherein the plurality of the partition wall plates include first partition wall plates and second partition wall plates, wherein the first partition wall plates have first slits extending downward from upper ends of the first partition wall plates, and the second partition wall plates have second slits extending upward from lower ends of the second partition wall plates, and by inserting the second slits into lower ends of the first slits, the first partition wall plates and the second partition wall plates are joined to each other.

6. A liquid material vaporization and supply system, comprising:
    a pressure-tight and air tight liquid material container storing a liquid material;
    a vaporizer according to claim 1, wherein the liquid material container is connected to supply liquid material to the chamber of the vaporizer; and
    a pressure regulating flow rate control device, wherein the vaporizer is connected to feed gas obtained by vaporization of the liquid material in the vaporizer to the pressure regulating flow rate control device.

7. A vaporizer comprising:
    (a) a chamber having an inlet and an outlet;
    (b) a heating device disposed to heat a liquid material contained in the chamber;
    (c) a partition wall structure that partitions the liquid material inside the chamber into a plurality of sections; and
    (d) a plurality of liquid distribution portions that allow liquid distribution among the plurality of sections partitioned by the partition wall structure, wherein
    the partition wall structure includes a grid-shaped, honeycomb-shaped, mesh-shaped, or pipe-shaped partition wall, and wherein the liquid distribution portions are notched portions formed in a lower end of the partition wall structure.

8. The vaporizer according to claim 7, wherein the partition wall structure comprises a plurality of partition wall plates joined together so as to cross each other.

9. The vaporizer according to claim 8, wherein the plurality of partition wall plates include first partition wall plates and second partition wall plates, and the first partition wall plates have slits extending downward from upper ends of the first partition wall plates, and the first partition wall plates are joined to the second partition wall plates by inserting the second partition wall plates into the slits of the first partition wall plates.

10. The vaporizer according to claim 8, wherein the plurality of partition wall plates include first partition wall plates and second partition wall plates, and the second partition wall plates have slits extending upward from lower ends of the second partition wall plates, and the second partition wall plates are joined to the first partition wall plates by inserting the first partition wall plates into the slits of the second partition wall plates.

11. The vaporizer according to claim 8, wherein the plurality of the partition wall plates include first partition wall plates and second partition wall plates, wherein the first partition wall plates have first slits extending downward from upper ends of the first partition wall plates, and the second partition wall plates have second slits extending upward from lower ends of the second partition wall plates, and by inserting the second slits into lower ends of the first slits, the first partition wall plates and the second partition wall plates are joined to each other.

12. A liquid material vaporization and supply system, comprising:
    a pressure-tight and air tight liquid material container storing a liquid material;
    a vaporizer according to claim 8, wherein the liquid material container is connected to supply liquid material to the chamber of the vaporizer; and
    a pressure regulating flow rate control device, wherein the vaporizer is connected to feed gas obtained by vaporization of the liquid material in the vaporizer to the pressure regulating flow rate control device.

13. The vaporizer according to claim 1, wherein liquid material is stored inside each section of the plurality of sections, and at least one first section of the plurality of sections is adjacent to at least four second sections of the plurality of sections, and the liquid distribution portions are disposed between the at least one first section and all of the at least four second sections.

14. The vaporizer according to claim 7, wherein liquid material is stored inside each section of the plurality of sections, and at least one first section of the plurality of sections is adjacent to at least four second sections of the plurality of sections, and the liquid distribution portions are disposed between the at least one first section and all of the at least four second sections.

15. A liquid material vaporization and supply system according to claim 6, further comprising a compartment that is not provided with a partition wall structure is formed in contact with a compartment that is provided with a partition wall structure.

16. A liquid material vaporization and supply system according to claim 12, further comprising a compartment that is not provided with a partition wall structure is formed in contact with a compartment that is provided with a partition wall structure.

* * * * *